July 7, 1964 M. M. MAY 3,140,408
SWITCH WITH PLURAL INPUTS TO, AND PLURAL FEEDBACK PATHS FROM, AN OPERATIONAL AMPLIFIER
Filed June 20, 1962
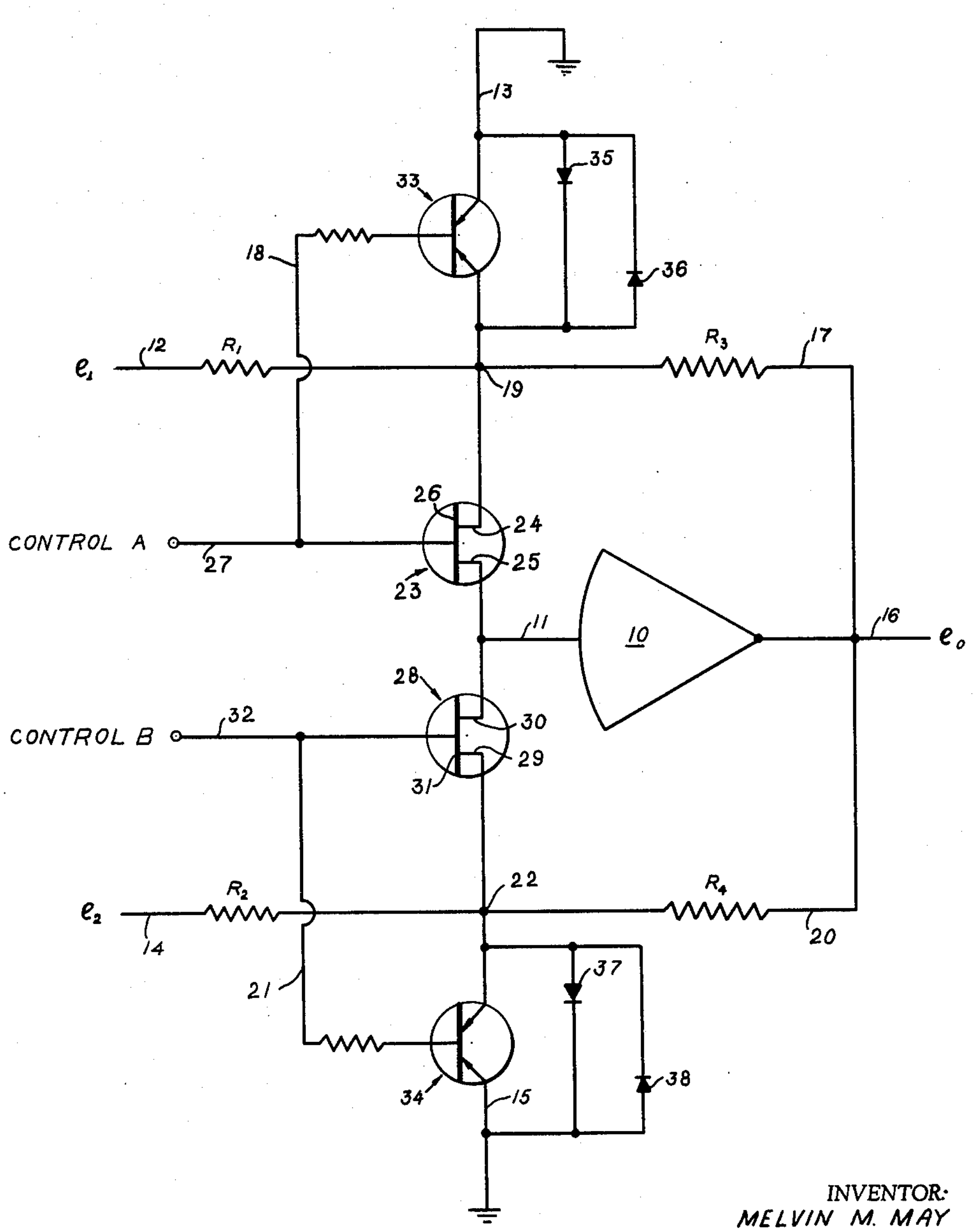
INVENTOR.
MELVIN M. MAY
BY Frederick Breitenfeld
ATTORNEY

United States Patent Office 3,140,408

Patented July 7, 1964

3,140,408

SWITCH WITH PLURAL INPUTS TO, AND PLURAL FEEDBACK PATHS FROM, AN OPERATIONAL AMPLIFIER

Melvin M. May, Spring Lake Heights, N.J., assignor to Computer Products Incorporated, Manasquan, N.J., a corporation of New Jersey Filed June 20, 1962, Ser. No. 203,865
3 Claims. (Cl. 307—88.5)

This invention relates generally to electronic switches, and has particular reference to fast-response switches utilizing solid state components.

It is a general object of the invention to provide a switch having special capabilities that make it particularly suitable for use in controlling the mode of high gain D.C. amplifiers used as operational amplifiers in analog computers.

A more particular object of the invention is to provide an improved electronic switch whose transfer function can be determined by an audio-frequency square wave control voltage, and whose response to the control signal is such that the required minimum control voltage is of practical magnitude and not excessive.

Another objective is to provide a switch that operates in such a way that none of the control voltage appears at the output.

Another object is to provide an electronic switch whose characteristics are such that when it is used to control an operational amplifier the inaccuracies (if any) caused by its use shall be less than 0.01%.

The achievement of these objectives is predicated upon a recognition of the special usefulness, for the purpose, of field effect transistors, i.e., transistors which respond to voltage rather than to current. A feature of the invention resides in the employment, in a novel manner, of field effect transistors as controlling components in an operational amplifier switching circuit.

Another feature of the invention lies in providing special grounding circuits, and automatic regulatory control means for closing and opening these circuits in predetermined relation to the operation of the field effect transistors, to prevent even the small output inaccuracies that would otherwise occur if the grounding circuits were not provided. A further feature resides in recognizing the usefulness of symmetrical transistors as control components for the grounding circuits.

A switch circuit embodying the features of this invention is shown by way of example in the accompanying figure.

A high gain D.C. amplifier 10 has its input terminal 11 connected to a plurality of input circuits leading to it in parallel. There may be any selected number of such input circuits, and in the interest of depicting the invention in a relatively simple form only two input circuits have been shown in the figure. One input circuit 12 includes an input impedance $R_1$; the other input circuit 14 includes an input impedance $R_2$. The amplifier output is at 16, and there is a negative feedback circuit for each input circuit. Thus, the feedback circuit 17, including the impedance $R_3$, leads from the output 16 to the input circuit 12, being connected to the latter at the junction 19; and similarly the feedback circuit 20, including the impedance $R_4$, joins the second input circuit 14 at the junction 22.

Within the feedback loop of the first input circuit, between the junction 19 and the amplifier input terminal 11, is a field effect transistor 23 having an anode 24, a cathode 25, and a grid 26. The importance of locating the field effect transistor within the feedback loop will be pointed out hereinafter. A control circuit 27 leads to the grid 26 and is adapted to apply a square wave voltage signal to which the transistor will respond. A zero voltage will establish an "on" condition allowing current to flow through the transistor from the anode 24 to the cathode 25; a negative voltage (of selected magnitude depending upon the transistor used) will establish an "off" condition blocking the passage of current through the transistor.

Similarly arranged within the feedback loop of the second input circuit, between the junction 22 and the amplifier input terminal 11, is a field effect transistor 28 having an anode 29, a cathode 30, and a grid 31; and a second control circuit 32 is connected to the grid to allow application of a square wave voltage signal in the manner described.

Under ideal conditions, if the transistor 23 is "on" and the transistor 28 is "off," the output voltage $e_0$ is stated by the equation $$e_0 = -\left(\frac{R_3}{R_1}\right)e_1 \qquad (1)$$

and similarly, if the transistor 28 is "on" and the transistor 23 is "off" the output $$e_0 = -\left(\frac{R_4}{R_2}\right)e_2 \qquad (2)$$

However, if the field effect transistor were arranged at a point in the input circuit which is outside the feedback loop, the impedance of the transistor would be in series with the input impedance whereby an error would be introduced. For example, if the impedance of the transistor 23 when it is "on" is represented by $R_6$, Equation 1 would become $$e_0 = -\left(\frac{R_3}{R_1 + R_6}\right)e_1 \qquad (3)$$

Since $R_6$ might be of the order of 2,000 ohms, a large error would be generated. By placing the field effect transistor between the junction 19 and the amplifier input terminal 11, i.e., within the feedback loop, the output voltage remains a function of $R_1$, $R_3$, and $e_1$ only.

Furthermore, the impedance of each transistor when it is "off," even though it is measurable in megohms, is sufficient to impose an error upon the other (i.e., the "on") circuit because it allows a fraction of the voltage of the presumably "off" circuit to affect the result. For example, if the "off" impedance of transistor 28 be represented by $R_5$ (and if the effect of $R_4$ be disregarded) Equation 1 becomes $$e_0 = -\left(\frac{R_3}{R_1}\right)e_1 - \left(\frac{R_3}{R_2 + R_5}\right)e_2 \qquad (4)$$

so that even if $R_5$ is as much as 100 times as large as $R_2$ an error of the order of 1% is introduced. In many applications, especially in operational amplifiers used in analog computer circuits, such an error is intolerable.

To overcome this, a special grounding circuit is associated with each input circuit, and it is controlled automatically by a special symmetrical transistor. Thus, from junction 19 (or elsewhere in the region between $R_1$ and $R_3$) a circuit 13 leads to ground, and in it is symmetrical transistor 33; and a similar grounding circuit 15 leads from the junction 22 and includes symmetrical transistor 34. Each of the transistors 33, 34 is a bilateral device, i.e., the impedance from collector to emitter is independent of the direction of current flow. Protection against unusually high voltages due to temporary overloads can be afforded by voltage-limiting diodes arranged in pairs 35, 36 and 37, 38, in shunted relation to the transistors 33, 34 respectively.

The control of transistor 33 is afforded by the circuit 18 connecting the control circuit 27 to the base of the transistor. Similarly the circuit 21 extends from the control circuit 32 to the base of the transistor 34.

In accordance with the objectives of the invention, the components are so chosen that the control signal which is effective to selectively block or pass current through any one of the field effect transistors is effective in the opposite manner with respect to the corresponding grounding transistor. For example, if a zero voltage is applied through control circuit 27 to the grid of field effect transistor 23 it will be effective to allow current flow through this transistor from the input circuit 12, and from feedback circuit 17, to the input terminal 11 of the amplifier; but it will be simultaneously effective to establish an "off" condition in grounding transistor 33. Similarly, a negative voltage pulse applied to the field effect transistor 23 will be effective to block current flow through the transistor 23 but will be simultaneously effective to close the corresponding grounding circuit 13. The same simultaneous but opposite effects are produced in the transistors 28 and 34 by control signals applied through circuits 32 and 21.

It follows that, whenever either field effect transistor is "open" its corresponding grounding circuit is automatically "closed," as a result of which the input voltage is ineffective to impair the accuracy of the other circuit when its field effect transistor is "closed." More precisely, the injurious effect of the input voltage of the "off" circuit is reduced to such a small fractional part of what it otherwise would be that it may be disregarded. Unusually high degrees of accuracy in output voltages are thus attained. Additionally, the control voltages do not affect the results. This same advantageous result is produced when there are more than two input circuits. Whenever any field effect transistor is "closed" no inaccuracies are imposed on the output by any of the input circuits which are "open."

While variations may be made in the actual voltages employed, it may be stated by way of example that an audio-frequency square wave control voltage alternating between zero and minus forty has proven satisfactory for analog computer applications of the switch described. Inaccuracies caused by such a switch are less than 0.01%.

What is claimed is:

1. In an operation amplifier circuit, an electronic switch comprising at least two input circuits leading in parallel to the input terminal of a high gain D.C. amplifier, a feedback circuit for each input circuit and connected to the latter at a junction, a grounding circuit for each input circuit, a field effect transistor in each input circuit between said junction and said input terminal of the amplifier, a grounding transistor in each grounding circuit, a control circuit for each field effect transistor for applying a signal effective to selectively block or pass current through said transistor, and a circuit for simultaneously applying said signal with opposite effect to the corresponding grounding transistor.

2. An electronic switch as defined in claim 1, wherein said grounding transistor is a symmetrical transistor.

3. An electronic switch as defined in claim 2, including a pair of voltage limiting diodes connected in opposed shunt relation to said grounding transistor.

No references cited.